United States Patent [19]

Yokota et al.

[11] Patent Number: 5,065,335

[45] Date of Patent: Nov. 12, 1991

[54] DECODING TYPE SELECT LOGIC GENERATING METHOD

[75] Inventors: Takayoshi Yokota; Keisuke Bekki, both of Hitachi; Nobuhiro Hamada, Hitachiota, all of Japan

[73] Assignee: Hitachi, Ltd., Tokyo, Japan

[21] Appl. No.: 323,968

[22] Filed: Mar. 15, 1989

[30] Foreign Application Priority Data

Mar. 18, 1988 [JP] Japan .................................. 63-63343

[51] Int. Cl.$^5$ ............................................. G06F 15/60
[52] U.S. Cl. .................................... 364/489; 364/488
[58] Field of Search ................. 364/488, 489, 490, 491

[56] References Cited

U.S. PATENT DOCUMENTS

| T938,005 | 9/1973 | Colton et al. | 364/490 |
|---|---|---|---|
| 4,613,940 | 9/1986 | Stenton et al. | 364/490 |
| 4,703,435 | 10/1987 | Darringer et al. | 364/488 |
| 4,833,619 | 5/1989 | Shimizu et al. | 364/489 |
| 4,922,432 | 5/1990 | Kobayashi et al. | 364/490 |

OTHER PUBLICATIONS

"Logic Reorganization System" by S. Nakamura et al., 15th Design Automation Conf., IEEE 1978, pp. 250-260.
"Experiments in Logic Synthesis" by J. Darringer et al., IEEE 1980, pp. 234-237.
"An Overview of Logic Synthesis Systems" by L. Trevillyan, 24th Design Automation Conf., IEEE 1987, pp. 166-172.
"A New Look at Logic Synthesis" by J. Darringer et al., 17th Design Automation Conf., IEEE—ACM 1980, pp. 543-549.
LSS, A system for production logic synthesis; IBM J. Res. Develop., vol. 28, No. 5, Sep. 1984, pp. 537-545.
Optimization of Combination Logic Using a Rule Based Expert System of IEEE Design and Test, pp. 22-32, Aug. 1985.

Primary Examiner—Parshotam S. Lall
Assistant Examiner—V. N. Trans
Attorney, Agent, or Firm—Kenyon & Kenyon

[57] ABSTRACT

A decoding type select logic generating method includes the steps of listing on a group basis input signal names and output destination signal names contained in register transfer descriptions and control codes for commanding execution of the register transfers for each of the same input signal names and same output destination signal names, simplifying logics by replacing the control code having the hamming distance of one by a bit meaning "don't care" on the group basis, generating AND gates for the control codes and the input signal names in each of the groups having the same input signal name and combining the outputs of the AND gates, generating AND gates for the control codes in each group having the same output destination signal name and combining the outputs of the AND gates for each of the output destination signal names, and combining the outputs of the groups each having the same input signal name and the groups each having the same output destination signal name.

8 Claims, 11 Drawing Sheets

|  | | | | TRANSFER DESTINATION REGISTER | TRANSFER SOURCE REGISTER |
|---|---|---|---|---|---|
| 1 | L M N | 0 0 0 | A ← B |
| 2 | L M N | 0 0 1 | A ← C |
| 3 | L M N | 0 1 0 | A ← D |
| 4 | L M N | 1 0 0 | E ← B |
| 5 | L M N | 1 0 1 | E ← C |
| 6 | L M N | 1 1 0 | E ← D |

LINE NUMBER | CONTROL CODE NAME | CONTROL CODE BIT | REGISTER TRANSFER DESCRIPTION

FIG. 5 (a) INPUT SIGNAL TABLE sourcep(0) ----→ NUMBER OF CODES | NAME OF INPUT SIGNAL | NAME OF OUTPUT DESTINATION SIGNAL | ---- | CONTROL CODE sourcep(1) ----→ NUMBER OF CODES | NAME OF INPUT SIGNAL | NAME OF OUTPUT DESTINATION SIGNAL | ---- | CONTROL CODE

FIG. 5 (b) OUTPUT SIGNAL TABLE sincp(0) ----→ NUMBER OF CODES | NAME OF OUTPUT DESTINATION SIGNAL | NAME OF INPUT SIGNAL | ---- | CONTROL CODE sincp(1) ----→ NUMBER OF CODES | NAME OF OUTPUT DESTINATION SIGNAL | NAME OF INPUT SIGNAL | ---- | CONTROL CODE

FIG. 7 (a) INPUT SIGNAL TABLE
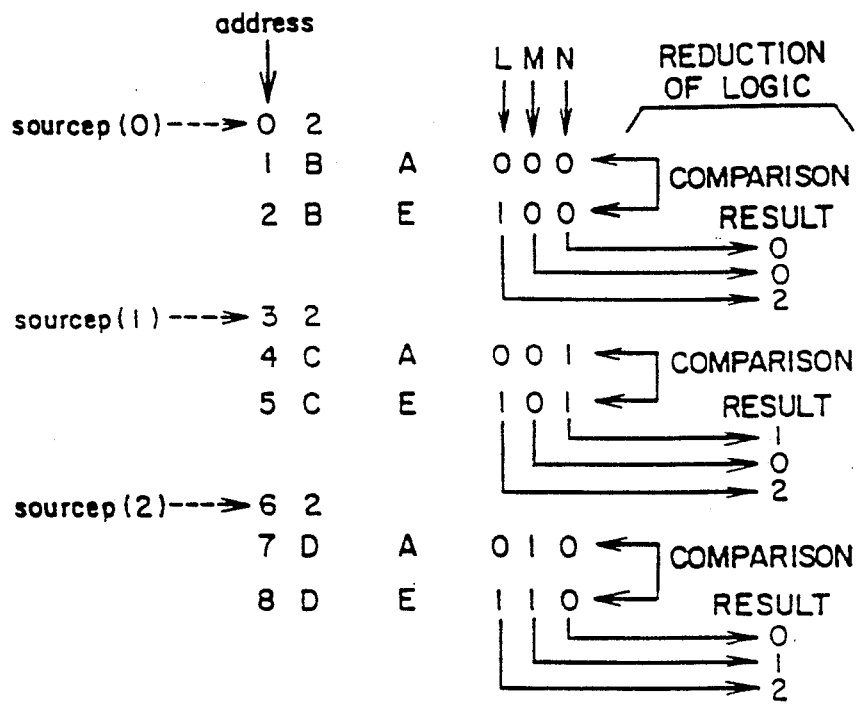
FIG. 7 (b) OUTPUT SIGNAL TABLE
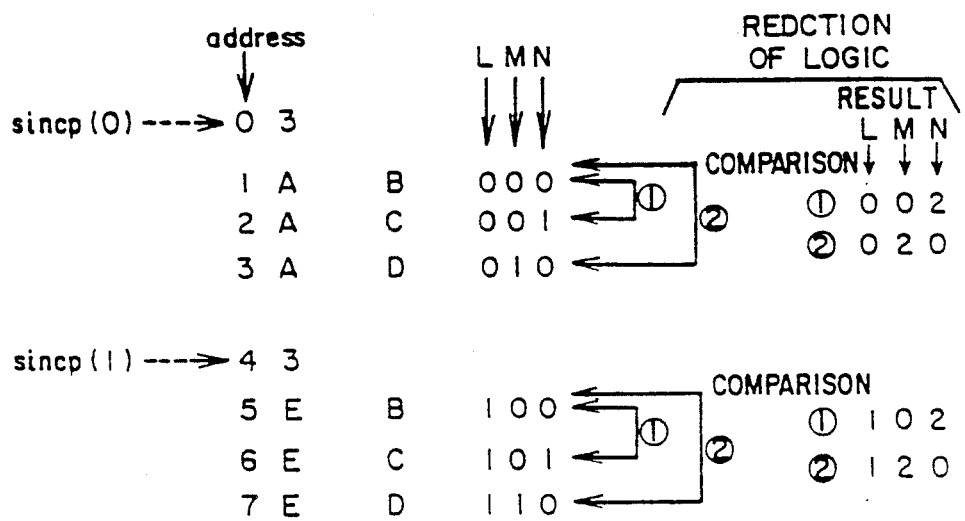

FIG. 9 (a) INPUT SIGNAL TABLE

|  | address |  | L | M | N |
|---|---|---|---|---|---|
| sourcep(0) ⟶ | 0 | 2 |  |  |  |
|  | 1 | B | A | 2 0 0 |
|  | 2 | B | E | null |
| sourcep(1) ⟶ | 3 | 2 |  |  |  |
|  | 4 | C | A | 2 0 1 |
|  | 5 | C | E | null |
| sourcep(2) ⟶ | 6 | 2 |  |  |  |
|  | 7 | D | A | 2 1 0 |
|  | 5 | D | E | null |

FIG. 9 (b) OUTPUT SIGNAL TABLE

|  | address |  | L | M | N |
|---|---|---|---|---|---|
| sincp(0) ⟶ | 0 | 3 |  |  |  |
|  | 1 | A | B | 0 0 2 |
|  | 2 | A | C | null |
|  | 3 | A | D | 0 2 0 |
| sincp(1) ⟶ | 4 | 3 |  |  |  |
|  | 5 | E | B | 1 0 2 |
|  | 6 | E | C | null |
|  | 7 | E | D | 1 2 0 |

(AND,(0,2),200) (select,200,B)
(AND,(1,2),201) (select,201,C)
(AND,(0,3),202) (select,202,D)

(AND,(2,4),203) (select,203,A)
(AND,(0,4),204) (select,204,A)
(AND,(2,5),205) (select,205,E)
(AND,(0,5),206) (select,206,E)

DECODING TYPE SELECT LOGIC GENERATING METHOD

BACKGROUND OF THE INVENTION

The present invention generally relates to a system for automating logical designing of LSIs and the like. More particularly, the present invention is concerned with a logic generating system suited for profitably automating the designing of logic circuits in which many a register-transfer logic is adopted, as in the case of LSIs adapted to operate with microprograms.

Heretofore, automatic generation of the logic circuits has been attempted mainly with the aid of design specifications described in terms of truth tables or logical expressions. On the other hand, in the process of manual logic design of LSIs as practiced, the job of designing a logic circuit in detail on the basis of a truth table and/or logical expressions has been done only in conjunction with small scale discrete circuitries. In practice, most specifications are described at a register-transfer level corresponding to a high abstraction level. In the field of the related art, however, no approach has been proposed concerning the generation of detailed logic design directly from the descriptions in such a register-transfer level specification.

As the related art, there are the techniques disclosed in "LSS, A system For Production Logic Synthesis"; IBM J. RES. Develop. Vol. 28, No. 5, (Sep., 1984), pp. 537–545, "Optimization of Combination Logic Using a Rule Based Expert System"; Journal of I.E.E.E. Design and Test, (Aug., 1985), pp. 22–32, and "Logic Synthesis System"; Information Processing Society of Japan, Research Materials For Design-Automatization, No. 34-2, (Dec., 1980).

The systems of the related art mentioned above lack the capability of analyzing the contents of the specification described at the register-transfer level of high abstraction for directly or straightforwardly generating the logic desired by the designer from such a specification. Consequently, the input specifications must beforehand be rewritten in terms of truth tables or logical expressions. This can give rise to a problem. When rewritten in terms of truth tables, the specifications are expressed as input/output relations, which means that the meaningful information of the "data transfer" becomes less definite. As a result of this, difficulty is naturally encountered in the automatic logic generation with respect to the realization of quality that is comparable to that of the manual design in which consideration can fully be paid as to the optimization. This is another problem. Besides, rewriting of the specifications in terms of the logical expressions requires a lot of time and labour almost as much as the detailed logic design so that the phrase "automatic logic generation" might be considered a misnomer

SUMMARY OF THE INVENTION

The present invention is to provide a system capable of automatically generating logic circuits as intended by a designer directly from a design specification of high abstraction level described at register-transfer level.

It is proposed according to an aspect of the present invention that a control code for commanding execution of a register transfer is first given, together with a register transfer description expressing a relation between a source of the data transfer and a destination or sink thereof. Subsequently, the specification of the register transfer level is analyzed to be automatically translated into a specification concerning a logic for selecting an input signal representing the source of the data transfer and a specification concerning a logic for selecting the destination or sink signal representing the destination (sink) of the data as transferred. Finally, the outputs of the input signal select logic and the destination signal select logic are automatically wired with fidelity to the register transfer description of concern.

More specifically, let's suppose, by way of example, that designing of a logic circuit having such transfer specification as exemplified in FIG. 3 of the accompanying drawings is commanded. Then, the system according to the present invention analyses the transfer specification to thereby automatically generate a complete wired diagram of a logic circuit such as shown in FIG. 13 which can satisfy the transfer conditions. In this context, the transfer specification shown in FIG. 3 can be expressed in terms of input/output relations shown in FIG. 4. More specifically, inputs of the logic circuit to be realized are connected to registers B, C and D while the outputs thereof are connected to registers A and E. The signals of the registers B, C and D are transferred to either one of the output registers A and E in dependence on values of three bits of a control code LMN, as indicated by arrows in FIG. 4.

The processing for analyzing the register transfer specification is executed in a manner mentioned below. In the first place, those of the register transfer descriptions in which the same input signal name makes an appearance are collected, wherein the corresponding control codes, destination names and the number thereof are listed in a table, as shown in FIG. 5(a). This table data is compressed for reducing logical redundancy for the purpose of simplification of the logic, as shown in FIGS. 7 and 9, whereon the input signal select logic comprising AND gates and OR gates are automatically generated.

Subsequently, those of the register transfer descriptions in which the same destination signal makes appearance an are collected to prepare a table containing the corresponding control codes, input signal names and the number in the format shown in FIG. 5(b), similar to the case of the input signal select logic generation mentioned above. The table data then undergo compression for reducing logical redundancy with a view to simplifying the logic, as shown in FIG. 7, whereon the output signal select logic comprising AND circuits and OR circuits is automatically generated.

Next, the outputs of the input signal select logic are then combined by an OR circuit for each of the destination signal names, the output of which is logically ANDed by preparing a further AND circuit with inputs having the same destination signal name which inputs come from the OR circuit and the output signal select logic, to thereby generate such a complete logic circuit as shown in FIG. 13.

According to the teachings of the present invention, it is possible to generate a logic circuit directly from the specification of the register transfer description at a high abstraction level while ensuring an improvement in the logic quality and a high processing speed.

Further, since the amount of descriptions can be reduced when compared with the truth-table specification, reduction in the memory area can be accomplished.

BRIEF DESCRIPTION OF THE DRAWINGS

FIG. 5(a) and (b) are diagrams structures employed in the system according to an embodiment of the invention;

FIGS. 7, 9a, 9b, 11a and 11b are diagram showing data available in the system according to an embodiment of the invention.

DETAILED DESCRIPTION

Figure 1:
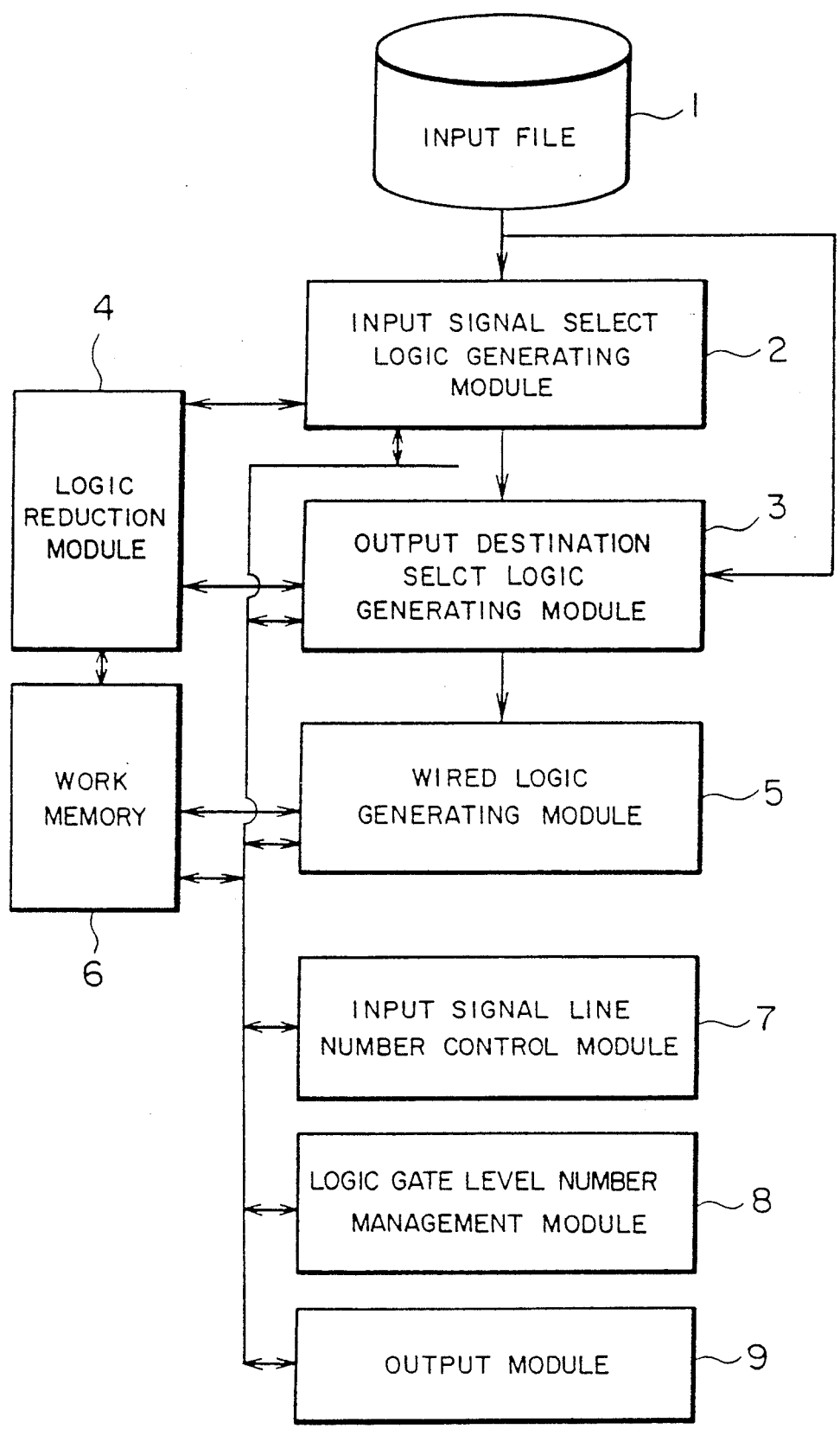
FIG. 1 is a block diagram showing schematically a general arrangement of a select logic generating system according to an exemplary embodiment of the present invention.
Figure 2:
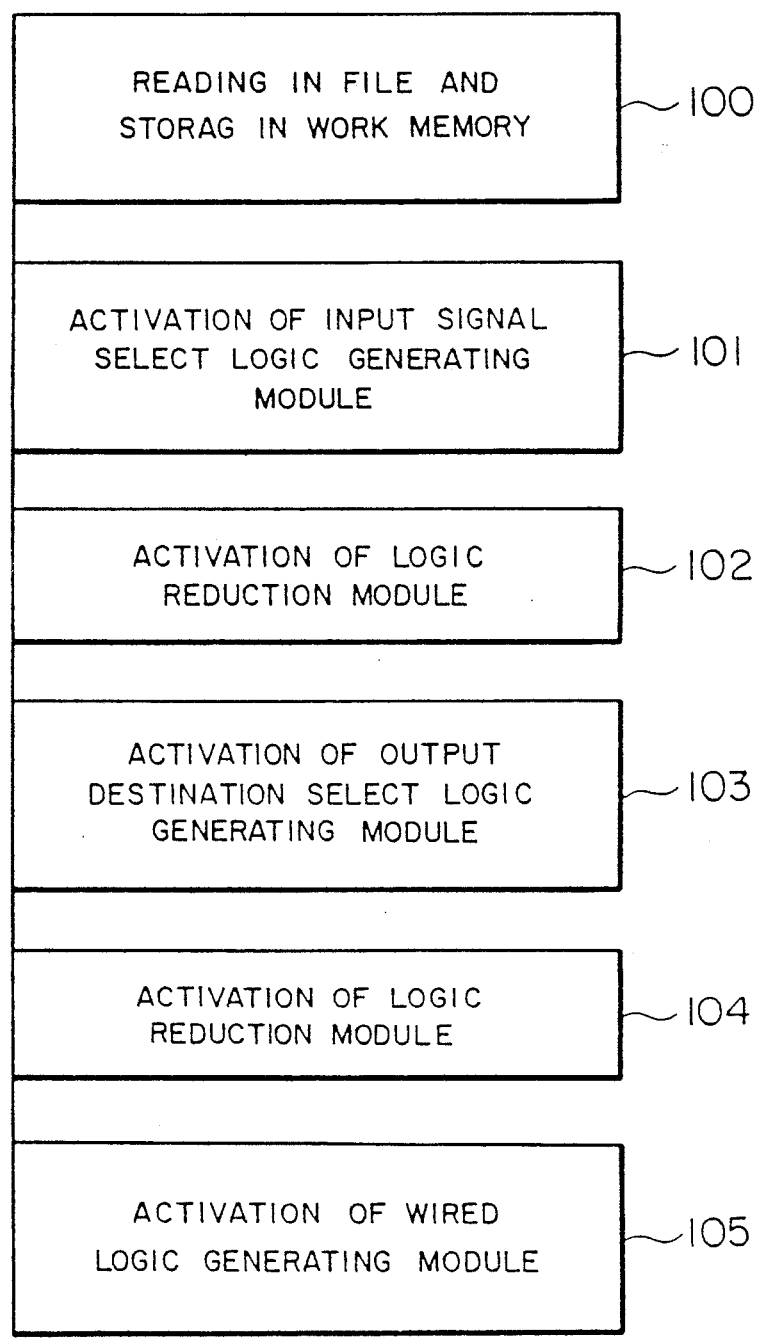
FIG. 2 is a flow chart for illustrating a flow of processings performed in the system of FIG. 1.

Now, the present invention will be described in conjunction with an exemplary embodiment thereof with reference to FIGS. 1 and 2, wherein FIG. 1 is a block diagram showing a general arrangement of the logic select system according to an embodiment of the invention and FIG. 2 is a flow diagram for illustrating operation of the system.

In FIG. 1: a reference numeral 1 denotes an input file storing a design specification described at a register transfer level; numeral 2 denotes an input signal select logic generating module; numeral 3 denotes an output destination select logic generating module; numeral 4 denotes a logic reduction module used in common by the logic generating modules 2 and 3 mentioned above; numeral 5 denotes a wired logic generating module for generating a wired logic for realization of register transfer in conformance with the specification on the basis of the logic generated by the abovementioned logic generating modules 2 and 3; numeral 6 denotes a work memory module serving as a work memory area required for the processings performed by the various modules mentioned above; numeral 7 denotes a control module for controlling or monitoring the number of input signal lines to a logic circuit to prevent the line number from becoming smaller than a predetermined value; numeral 8 denotes a logic gate level number managing module for determining arithmetically a delay time involved in the logic circuit; and numeral 9 denotes an output module through which the numbers of the logic gate levels and the logic circuit as generated are outputted.

Referring to FIG. 2 along with FIG. 1, the design specification described at the register transfer level is read out from the input file 1 and stored in the work memory module 6 at a step 100. At this juncture, it is assumed, by way of example, that the design specification of concern consists of such register transfer descriptions as illustrated in FIG. 3.

Figures 3, 4:
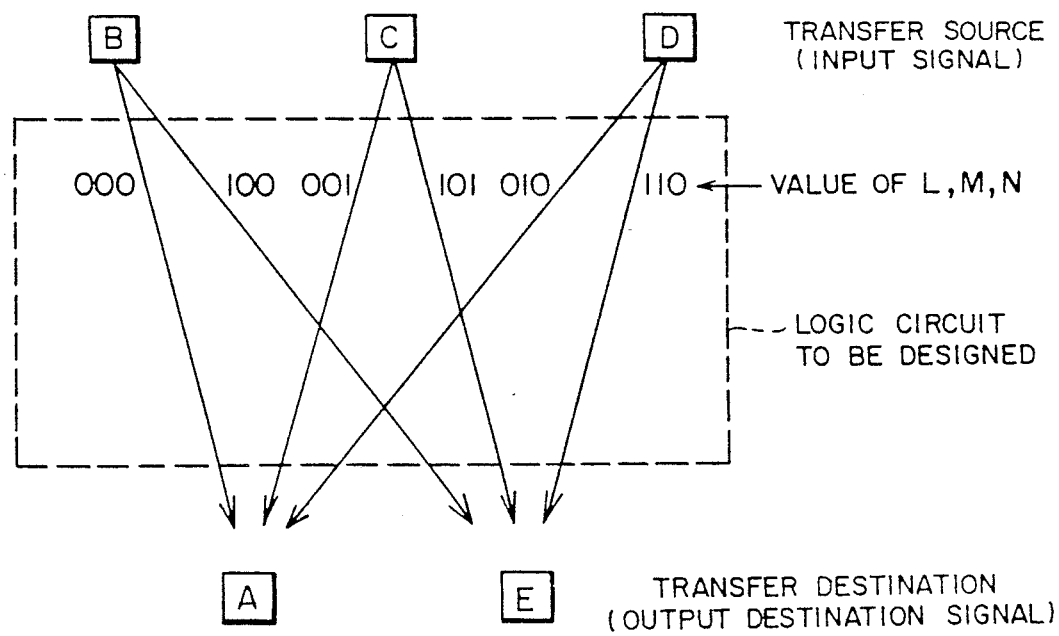
FIGS. 3 and 4 are views showing a typical example of design specification according to an embodiment of the invention.

More specifically, referring to FIG. 3, characters A, B, C, D and E represent, respectively, names or identifiers of the registers participating in the transfer operation, while characters LMNs represent, respectively, the names or identifiers of logical control codes, wherein each of A to E and L to N is stored in a one-bit register.

Signals representing the input registers of a transfer source in which the transfer origins and signals representing output registers of a transfer destination are handled as the input signals and the output destination signals, respectively, in the logic design. Referring to a first line 1 in FIG. 3, the control code LMN assumes a bit value of "000", which means that the signal of the register B is to be transferred to the register A.

FIG. 4 illustrates an example of the design specification. In this conjunction, it is contemplated with the present invention to automatically generate a logical circuit for performing the transfers indicated by arrows. As the result, there is realized a logic circuit shown in FIG. 13.

Turning back to FIG. 2, the input signal select logic generating module 2 shown in FIG. 1 is activated at a step 101. In this processing step, the specification of the logic circuit supplied as the input data is transferred to a data structure illustrated in FIG. 5 by taking advantage of the input signals. In FIG. 5, "sourcep(0)"; "sourcep(1)" and "sincp(0)"; "sincp(1)" represent types of the input signals and the output destination signals indicating the transfer sources (or origins) and the transfer destinations (or sinks), respectively, according to the transfer specification. The number of codes represent how many times the same input signal and the same output destination signal make appearance, respectively, in the transfer specification. The input signal names and the output destination signal names correspond to the input/output registers which are extracted and listed from the register transfer descriptions concerning the transfer source registers and the transfer destination registers shown in FIG. 3. The control code is a binary code for commanding the corresponding register transfer and represented by three bits of LMN.

A flow of this processing will be explained with reference to FIG. 6. First, at an initialization step 200, the input signal identifying number "ns" is set to "0" and a pointer "sourcep(ns)" indicating the type of the input signal is also set to "0". Further, a blank list [11] is placed in a source list for the input signals of concern.

Next, at a step 201, a pointer "rtp" of the register transfer description defining the input/output relations in the register transfer (this description will hereinafter be termed RT description) is set to "1". The pointer "rtp" represents the number to serve as a mark or index for retrieving sequentially all the input/output relations involved in the register transfer.

Turning back to FIG. 3, the pointers "rtp" are assigned with the numbers "1" to "6", respectively, in this order from the top to the bottom. When rtp=1, by taking advantage of the input signal B, execution of a program for collecting in a same group those transfer descriptions which contain the input signal B in the transfer source register is started.

Figure 6:
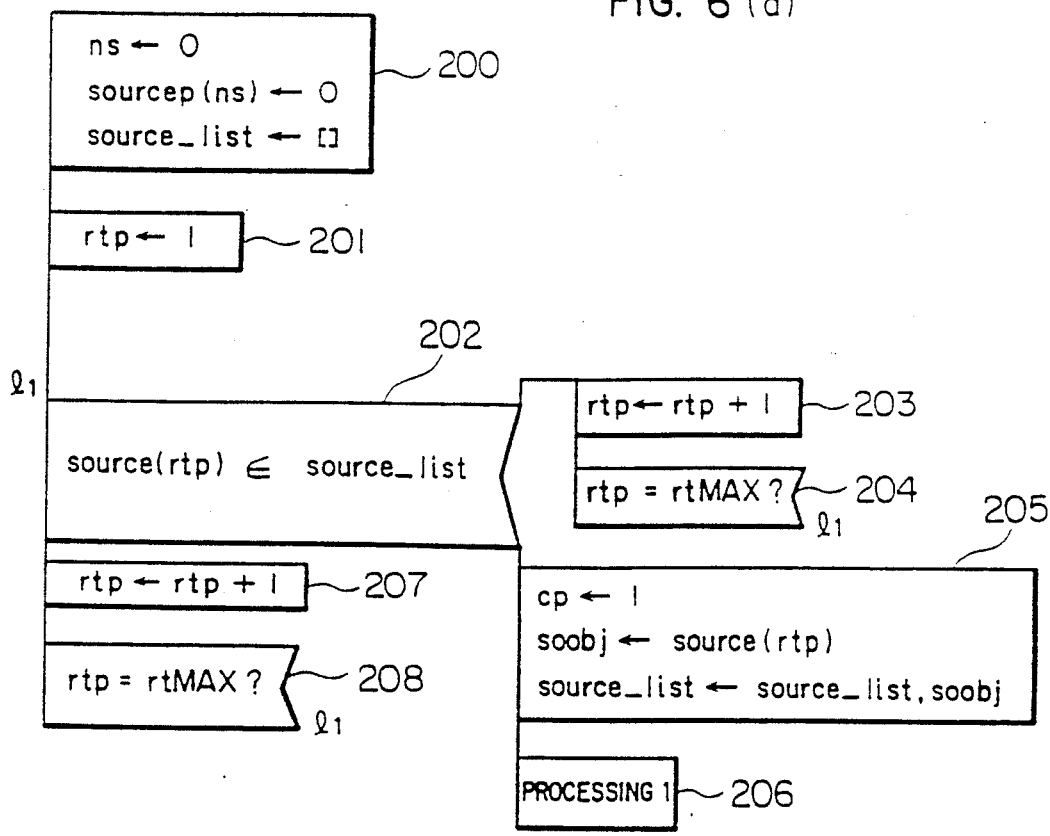
FIGS. 6a, 6b, 8a, 8b 10 and 12 are flow charts for illustrating in detail the processings performed in the system according to an embodiment of the invention.
Figure 6:
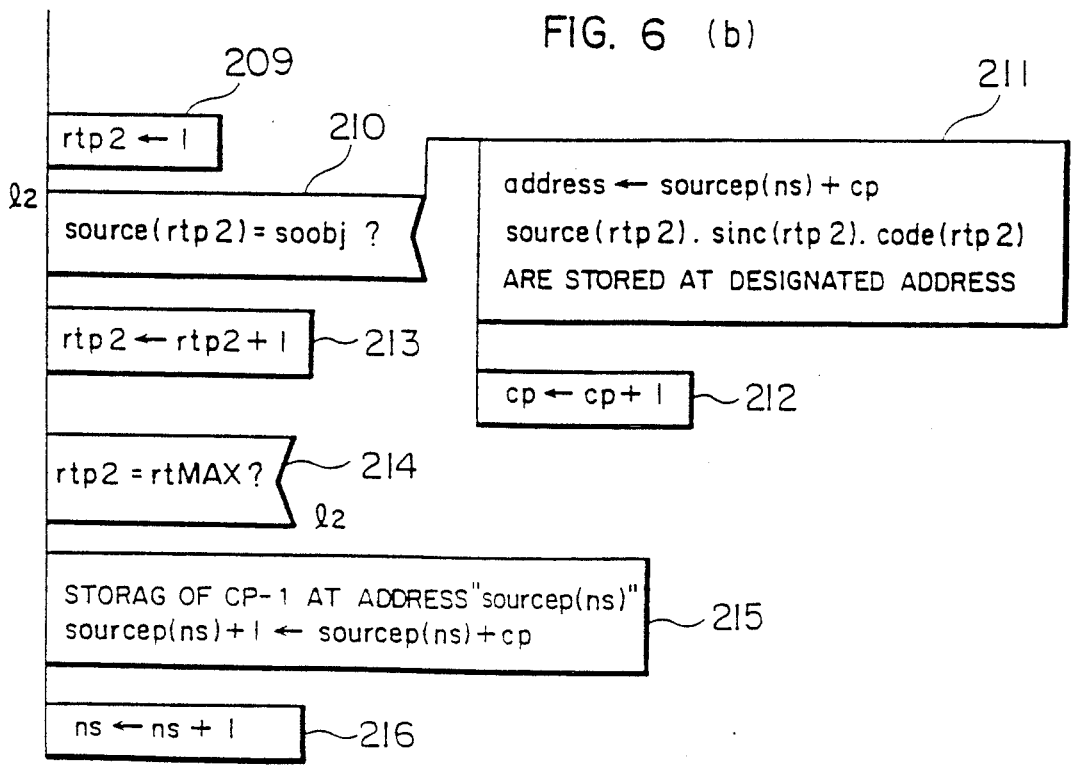

Referring to FIG. 6, at a step 202, the input signal name is extracted from the RT description designated by the pointer "rtp" and is used as the source pointer "source(rtp)" to check whether the extracted input signal name is contained in the source list. When the input signal name of concern is contained in the source list, decision is made that the analysis for the input signal name of concern has been completed, whereupon the processing proceeds to a step 203 at which the pointer "rtp" is incremented by one. Subsequently, at a step 204, decision is made as to whether or not the value of the pointer "rtp" exceeds the maximum line number "rtMAX" of the RT description. When the maximum line number "rtMAX" is not exceeded, the processing branches to the step 201 to execute the processing for the next input signal of concern. At this juncture, it should be mentioned that the maximum line number "rtMAX" also represents a total number of the transfers of various types which make appearance in the RT description.

On the other hand, unless the input signal name extracted as the source pointer "source(rtp)" is contained in the source list, decision is made that all the input signals of concern have not yet been collected, whereon the processing proceeds to a step 205. At this step 205, the pointer "cp" is set to "1", and the input signal name "source(rtp)" now under consideration is added as the signal name "soobj" to the source list.

Subsequently, at a step 206, the processing 1 is executed for collecting in one table all the RT descriptions containing the same input signal name as the input signal name "soobj" under consideration. To this end, at a step 209, the pointer "rtp2" for the RT description is set to "1". At a next step 210, decision is made as to whether the input signal name "source(rtp2)" designated by the pointer "rtp2" is equal to the abovementioned signal name "soobj". If so, the processing branches to a step 211. The affirmative answer resulting from the decision step 210 means that the RT description contains the same input signal name. Accordingly, the processing for grouping the RT descriptions in the same table is performed at a step 211.

At the step 211, "sourcep(ns)+cp" is made use of as the address to store "source(rtp2)" representing the input signal name, "sinc(rtp2)" representing the output destination signal name and "code(rtp2)" representing the control code in the work memory.

Next, at a step 212, the pointer "cp" is incremented by "1". The count number of "cp" is utilized for arithmetically determining the number of RT descriptions having the same input signal.

At a step 213, the RT description pointer "rtp2" is incremented by "1".

Subsequently, at a step 214, the RT description pointer "rtp2" is compared with the maximum line number "rtMAX" to ascertain whether or not all the input signals have been checked. Unless the pointer "rtp2" equals to the line maximum number "rtMAX", the processing branches to the step 210.

On the other hand, when the count value of the RT description pointer "rtp2" has attained the maximum line number "rtMAX", the processing proceeds to a step 215, wherein the value of "cp1" is stored as the number of the RT descriptions containing the same input signal in the work memory at the address "sourcep(ns)" thereof, being followed by setting the succeeding storage address "sourcep(ns +1)" as "sourcep(ns)+cp" with "ns" being incremented by "1". The processing then comes to an end.

At this level, the address for the data of the next input signal of concern "sourcep(1)" is set.

Subsequently, the processing proceeds to a step 207 where the pointer "rtp" is incremented by "1". Unless the pointer "rtp" has attained the maximum line number "rtMAX", the processing branches to the step 202 to pay consideration to the next input signal C. If otherwise, the processing comes to an end.

When the processing has been performed in the manner described above, a table of data for the input select logic such as that shown in FIG. 7 is prepared in the work memory 6 for the specification descriptions shown in FIG. 3 in such a format as shown in FIG. 7(a).

Next, at a step 102 shown in FIG. 2, the logic reduction module 4 is activated for the purpose of reducing redundancy in the logic collected by the input signal select logic generating module 2 through the processing described above to thereby simplify the logics.

The logic reduction is realized in software capable of processing the decimal code. More specifically, for the control codes at the addresses 1 and 2 shown in FIG. 7(a), the bit values corresponding to the control code L, by way of example, are compared, wherein the code L having different bit values, e.g. bit values of "0" and "1" (i.e. having a hamming distance equal to "1") is replaced by an uniform code "2" meaning "don't care" code. In other words, only those of the control codes that have the same bit values (i.e. those for which the hamming distance is not equal to "1") are considered as the valid signals The results of the above comparison are illustrated in FIG. 9(a) at the addresses 1 and 2. Assuming, by way of example, that data "200" is present in the input signal selection logic generating module, only the two less significant digits "00" are regarded as the valid signals By taking advantage of these two less significant digits "00", decision can be made such that the transfer source (origin) register is "B".

Due to the simplification of the logic as described above, the control codes of three bits can be handled as the valid information codes each of two bits. In case the comparison between the two control codes results in that the two codes are the same as the result of replacement by "2" meaning "don't care" code, one of the two codes is selected as the valid control code while the other is substituted for by "null" meaning that the other code need not be taken into consideration in the logic design.

Figure 8:
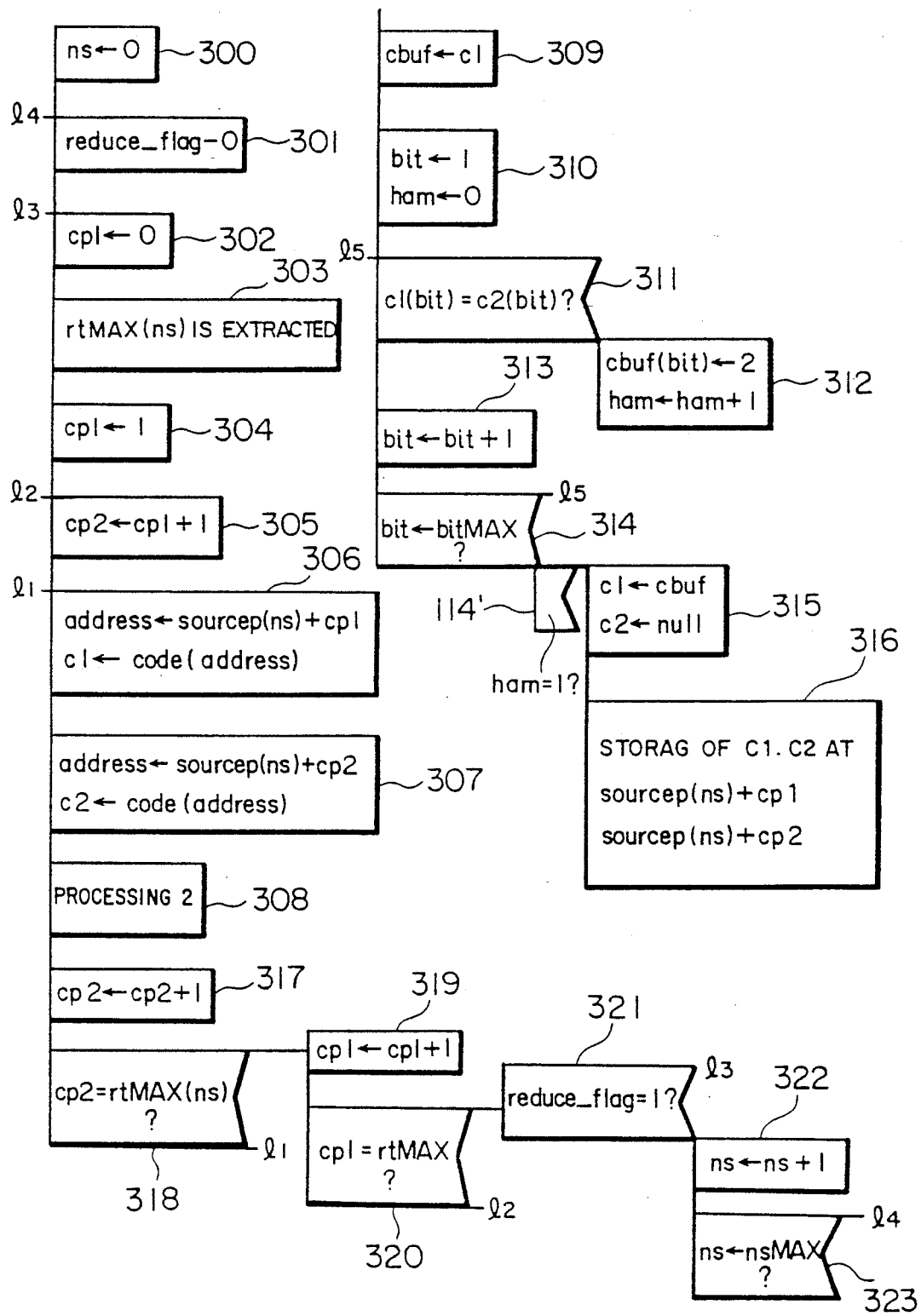

A flow of processing performed by the logic reduction module 4 for the data table shown in FIG. 7(a) will be explained with reference to FIG. 8.

At first, the identification number "ns" of an input signal of concern is set to "0" to take into consideration the data table designated by the pointer "sourcep(0)".

Next, at a step 301, a reduce flag indicating that no logic reduction has been performed is cleared.

At the next step 302, a pointer "cp1" for reading out the total number of the control codes is set to "0".

Subsequently, at a step 303, the total number "rtMAX" of the control codes stored at the address indicated by the abovementioned pointer is read out. For "sourcep(0)", rtMAX="2".

The processing then proceeds to a step 304 where the code pointer "cp1" is set to "1". This means that the address "1" is designated.

At a step 305, the pointer "cp2" of the code for comparison is determined by incrementing the code pointer "cp1" by "1", whereby the address "2" is designated.

At a step 306, "sourcep(ns)+cp1" is placed at the address. Further, the control code "code" having the address "sourcep(ns)+cp1" is read out and placed in "c1". In other words, "000" at the address "1" is placed in "c1".

At a step 307, "sourcep(ns) +cp2" is placed at the address, and the control code "code" having this address is read out and placed in "c2". As the result of this, "100" at the address "2" is placed in "c2".

Subsequently, processing 2 is started from a step 308.

At a step 309 of this processing 2, the content of the control code "c1" is mapped to "cbuf".

At a step 310, "1" is placed in the bit pointer and the hamming distance variable "ham" is cleared. At a next step 311, decision is made as to whether the control codes "c1" and "c2" are equal to each other in respect to the value at the respective bit positions indicated by the bit pointer. In case the result of the decision is negative, the corresponding bit position of "cbuf" receives the numeral "2" meaning "don't care".

At a step 313, the bit pointer value is incremented by "1". Next at a step 314, the value of the bit pointer is checked. Unless the value of the bit pointer has attained a maximum bit value "bitMAX", the processing branches to the step 311. If otherwise, decision is made that all the bits have completely been checked, whereupon the processing proceeds to a step 114'.

At the step 114', it is checked whether the hamming distance of the two logics "c1" and "c2" is "1" or not. When the hamming distance is not "1", this means that reduction of the logic is impossible. Accordingly, nothing is done, and the processing proceeds to a step 317. If otherwise, a step 315 is executed.

At the step 315, the content of "cbuf" is placed in "c1" with the content of "c2" being nullified (null), whereupon the processing proceeds to a step 316.

At the step 316, the contents of "c1" and "c2" are stored at the addresses "sourcep(ns)+cp1" and "sourcep(ns)+cp2", respectively. This means that the logical reduction for the two control codes at the addresses 1 and 2 has been completed.

After the processing 2 has been executed in this manner, a step 317 is executed.

At the step 317, the pointer "cp2" is incremented by "1" for designating a new one of the control codes for the comparison, whereupon the processing proceeds to a step 318.

When the value of "cp2" has attained the total number "rtMAX(ns)" at the step 318, the processing proceeds to a step 319. If otherwise, the processing branches to the step 306.

At the step 319, the pointer "cp1" is incremented by "1", being followed by a step 320.

When it is found at the step 320 that the value of "cp1" has attained the total number "rtMAX(ns)" of the codes, the processing proceeds to a step 321 and, otherwise, it branches to the step 305.

When the reduce flag is "1" at the step 321, this means that the possibility of logic reduction still exists. Accordingly, the processing branches to the step 302. Unless the reduce flag is "1", a step 322 is executed.

At the step 322, the pointer "ns" (input signal identification number) is incremented by "1", whereupon the processing is transferred to the succeeding data table "sourcep(1)".

At a step 323, decision is made as to whether or not the pointer "ns" has attained a maximum value "nsMAX" thereof. Unless the maximum value is attained, the processing branches to the step 301. Otherwise, all the processing for the logic reduction is terminated.

As a result of simplification of the logic implemented through the processing described above, the input select logic data table shown in FIG. 7(a) is transformed to such a format as shown in FIG. 9(a).

Referring to FIG. 2, at a step 103, the output destination select logic module 3 shown in FIG. 1 is activated. The processing performed in this module is substantially the same as the processing for the input signal select logic generation described hereinbefore in conjunction with FIG. 6 using the output destination signal name in place of the input signal name. Through the processing at this step 103, an output destination select logic data table shown in FIG. 7(b) is prepared.

At a step 104 in FIG. 2, logic reduction processing is applied to the output destination select logic in the same manner as described hereinbefore in conjunction with processing step 102 in FIG. 2. This logic reduction processing for output destination select logic is the same as the processing for the input signal select logic generation described previously in conjunction with FIG. 8. the output destination signal name replacing the input signal name in the process in the latter.

As the result of the logic reduction processing at the step 104, the output destination logic is simplified, as is illustrated in FIG. 9(b).

Figure 13:
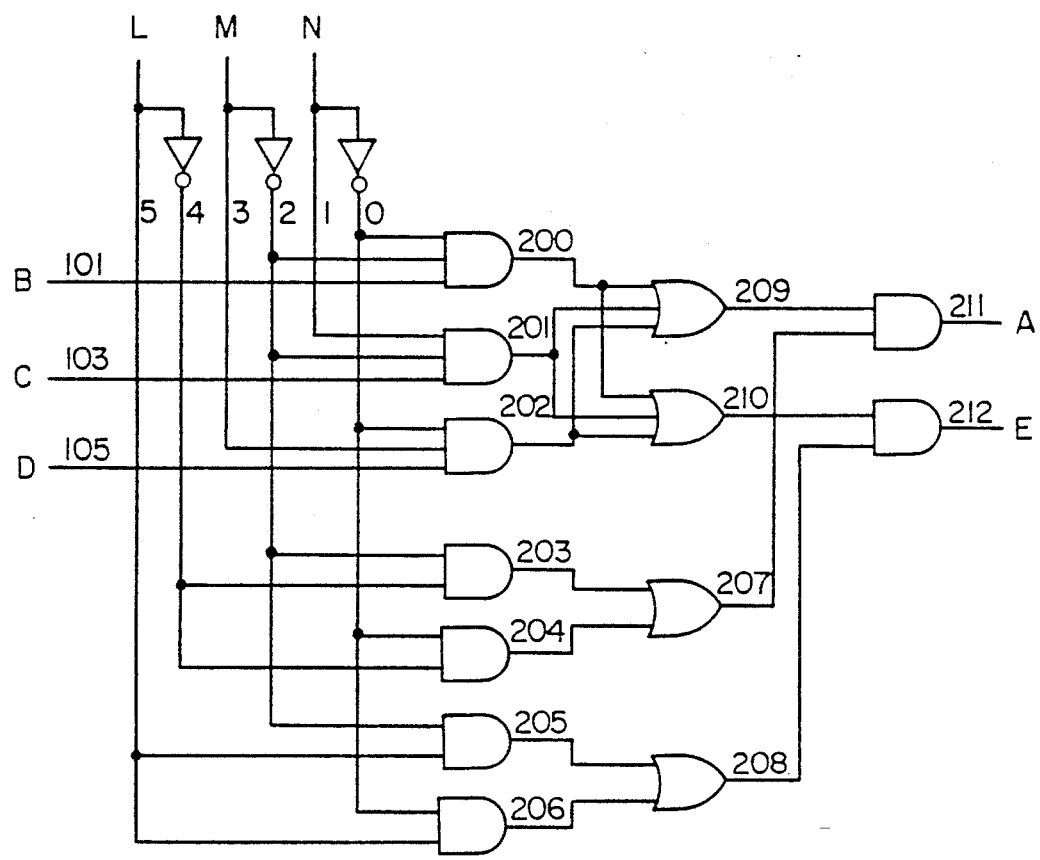
FIG. 13 is a diagram showing a target logic circuit generated as the output of the system according to an embodiment of the present invention.

Next, the wired logic generating module 5 shown in FIG. 1 is activated. In this wired logic generating module 5, input/output signal lines of AND gates 200 to 206 shown in FIG. 13 are numbered, and additionally determination is made on the basis of predetermined rules how the input lines are to be connected with the AND gates by consulting the data tables shown in FIG. 9.

Figure 10:
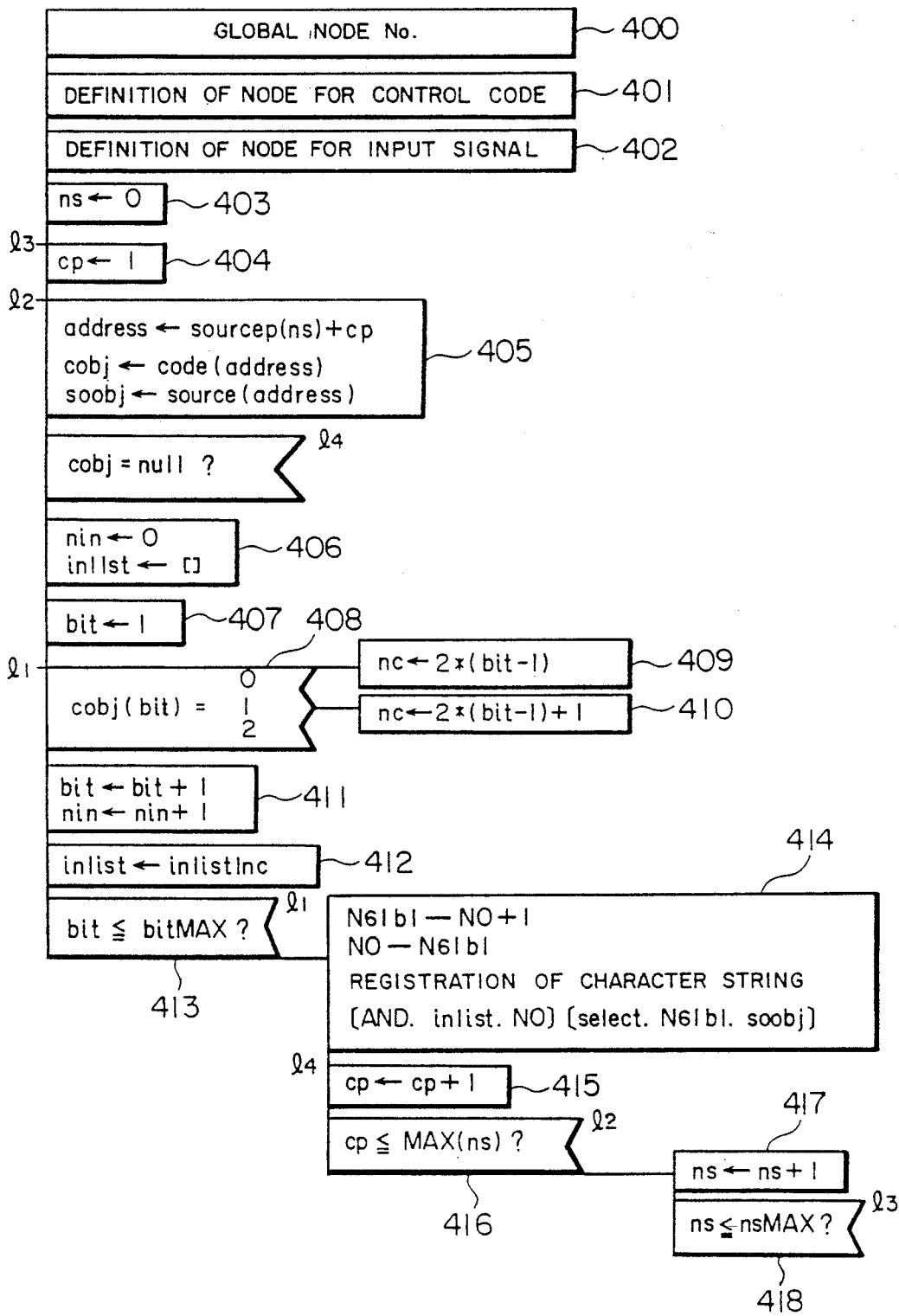

A flow of processing performed by the wired logic generating module 5 will be explained with reference to FIG. 10.

Referring to the figure, at a step 400, global node numbers N are provided for discriminatively identifying nodes for interconnections in the logic circuit to be generated, and a value "NO" is placed in the global node number.

At a next step 401, node numbers for the control codes L, M, N are defined To this end, the node numbers are assigned in accordance with the expression:

$$2 \times (bit - 1) + code\ (bit)$$

starting from the least significant bit of the control code corresponding to the control code N, the bit values being represented by "1", "2" and "3", respectively. In accordance with this expression, there can be determined the numbers "0" to "5" assigned to the lines for the control signals L, M, N shown in FIG. 13. A concrete example of this procedure will be described below. Of the bits of the control codes L, M, N, the bit "2" representing "don't care" can be neglected. Accordingly, only the bits of "0" and "1" need to be considered. The bit number of the control code L is "3". Accordingly, the number of the line for the bit value "0" of the control code L can be determined as follows:

$$2 \times (3-1) + 0 = 4 + 0 = 4$$

The number of the lines for the bit value of "1" is:

$$2 \times (3-1) + 1 = 5$$

For the control code M for which the bit number is "2", the line number for the bit value "0" is:

$$2 \times (2-1) + 0 = 2$$

Similarly, the line number for the bit value "1" is:

$$2 \times (2-1) + 1 = 3$$

For the control code N for which the bit number is "1", the line number for the bit value "0" can be determined as follows:

$$2 \times (1-1) + 0 = 0$$

Similarly, the line number for the bit value "1" is:

$$2 \times (1-1) + 1 = 1$$

At a succeeding step 402, the node numbers corresponding to the input signals are determined in accordance with the following expression:

$$2 \times (\text{input signal order} - 1) + \text{polarity} + \text{bias value}$$

In this conjunction, it should be noted that a bias value of a constant is added because of necessity for the node numbers of concern assuming values sufficiently distanced from those of the node numbers of the input lines for the control codes for ensuring definiteness. The polarity in the above expression assumes "1" when the input signal is connected as it is, while it assumes "0" when the input signal is NOTed (inverted) beforehand. In the case of the illustrated embodiment of the invention, it is assumed that the bias value is 100 (one hundred).

The input signal order is such that B=1, C=2 and D=3. Accordingly, on the assumption that the polarity is not changed, $$2 \times (1-1) + 1 + 100 = 101 \text{ for } B,$$

$$2 \times (2-1) + 1 + 100 = 103 \text{ for } C, \text{ and}$$

$$2 \times (3-1) + 1 + 100 = 105 \text{ for } D.$$

In the succeeding steps, it is determined in what manner the node numbers and the AND gates are to be wired.

Namely, at a step 403, the input signal identification number "ns" is set to "0", whereby the address "0" of "sourcep(0)" shown in FIG. 9 is designated.

Next, at a step 404, the relative pointer "cp" indicating the number of lines storing therein the control signal is placed with "1".

At a next step 405, "sourcep(ns) +cp" is placed in the address, whereby the address 1 is designated. Further, the input signal name B and the control code 200 stored at the abovementioned address are read out to be placed in "soobj" and "cobj", respectively.

When "cobj" is "null", the processing jumps to a step 415 without generating any AND gate. Otherwise, the AND gate generation is performed through the processing steps mentioned below.

Namely, at a step 406, and AND gate input number "nin" is set to "0" with a blank list being placed in a list termed "inlist" which serves for registering the names or identifiers of the input signals to the AND gate.

At a step 407, a bit pointer "bit" is set to "1".

At a succeeding step 408, the value of "cobj(bit)" is determined, as mentioned below. When this value is "0", then the node number "nc" is determined in accordance with the aforementioned expression "2×(bit−1)" at a step 409. If the node number is "1", the processing proceeds to a step 410 where the node number "nc" is determined in accordance with "2×(bit−1)". Thus, it can be determined which of the AND gates is inputted with the node number of the control code concern.

Subsequently, at a step 411, the bit pointer "bit" is incremented by "1" with the AND gate input number "nin" being also incremented by one.

Next, at a step 412, the list "inlist" is combined with a list enumerating the values of the node number "nc" to thereby update the list "inlist".

At a step 413, decision is made as to whether or not the bit pointer "bit" exceeds the maximum value "bit-MAX" for one of the control codes. If not, the processing branches to the step 408, where the correspondence relation to the AND gate is determined for the remaining bit codes. On the other hand, when the value "bit-MAX" is exceeded, the processing proceeds to a step 414.

At the step 414, the current global node number "NO" is incremented by "1" and placed in "Nglbl" to be used as the updated global node number "NO". Subsequently, description [AND, inlist, NO] of the AND gate having the output signal node number (the number attached to the output of the AND gate, as shown in FIG. 13) equal to the abovementioned global node number is generated in the work memory module 6.

Further, data of a set of the input signal name "soobj" and the output signal node number of the AND gate given by [select, Nglbl, soobj] is registered in the work memory module 6.

At this time, if the input number "nin" of the AND gate exceeds a predetermined value, the number of the AND gates to be generated is increased to thereby prevent the value of "nin" from exceeding the input number of one AND gate. This can be realized by checking constantly the input signal line number by means of the input signal line number control module 7 shown in FIG. 1 to thereby control correspondingly the individual logic generating modules. By way of example, it is example, it is assumed that the input number of an AND gate is constrained not to exceed "two" and that the AND gate given by the description

[AND, [0, 2, 4], 200][select, 200, B]

is generated. The number of the inputs of the AND gate is "three" (i.e. greater than two). Accordingly, this description is subdivided into descriptions about two AND gates, as follows:

[AND, [0,2], 200

[AND, [200, 4], 201][select, 201, B]

Through the division mentioned above, it is possible to limit the number of the inputs to the AND gate.

Next, at a step 415, the pointer "cp" is incremented by "1" for performing the processing to realize an AND gate for another one of the control codes.

At a step 416, it is decided whether or not the value of the pointer "cp" exceeds "rtMAX(ns)", to thereby check if the processing has been completed for all the control codes. When the result of this decision is negative, the processing branches to the step 405. Otherwise, a step 417 is executed where "ns" is incremented by "1" to allow the processing to be transferred for the preparation of a new data table.

In a step 418, decision is made as to whether "ns" exceeds "nsMAX". If not, the processing branches to the step 404. Otherwise, this series of processings comes to an end.

Through the processings described above, such descriptions as illustrated in FIG. 11(a) are generated in the work memory, starting from the group of the reduced codes shown in FIG. 9(a) which are resulted from the input select logic processing.

Referring to FIG. 11(a), description [AND, [0, 2], 200] on the first row means that the AND gate of concern has inputs of the node numbers "0" and "2" and an output having the node number of "200". Further, description [select, 200, B] the signal B is outputted on the line having the node number of "200".

The processing described above is next performed in the output destination select logic module. As the result, such descriptions as illustrated in FIG. 11(b) are prepared in the work memory from the group of reduced codes obtained through the output destination logic reduction processing.

Finally, the processing for input and output wiring is performed, which will be explained below by referring to FIG. 12.

Figures 11, 12:
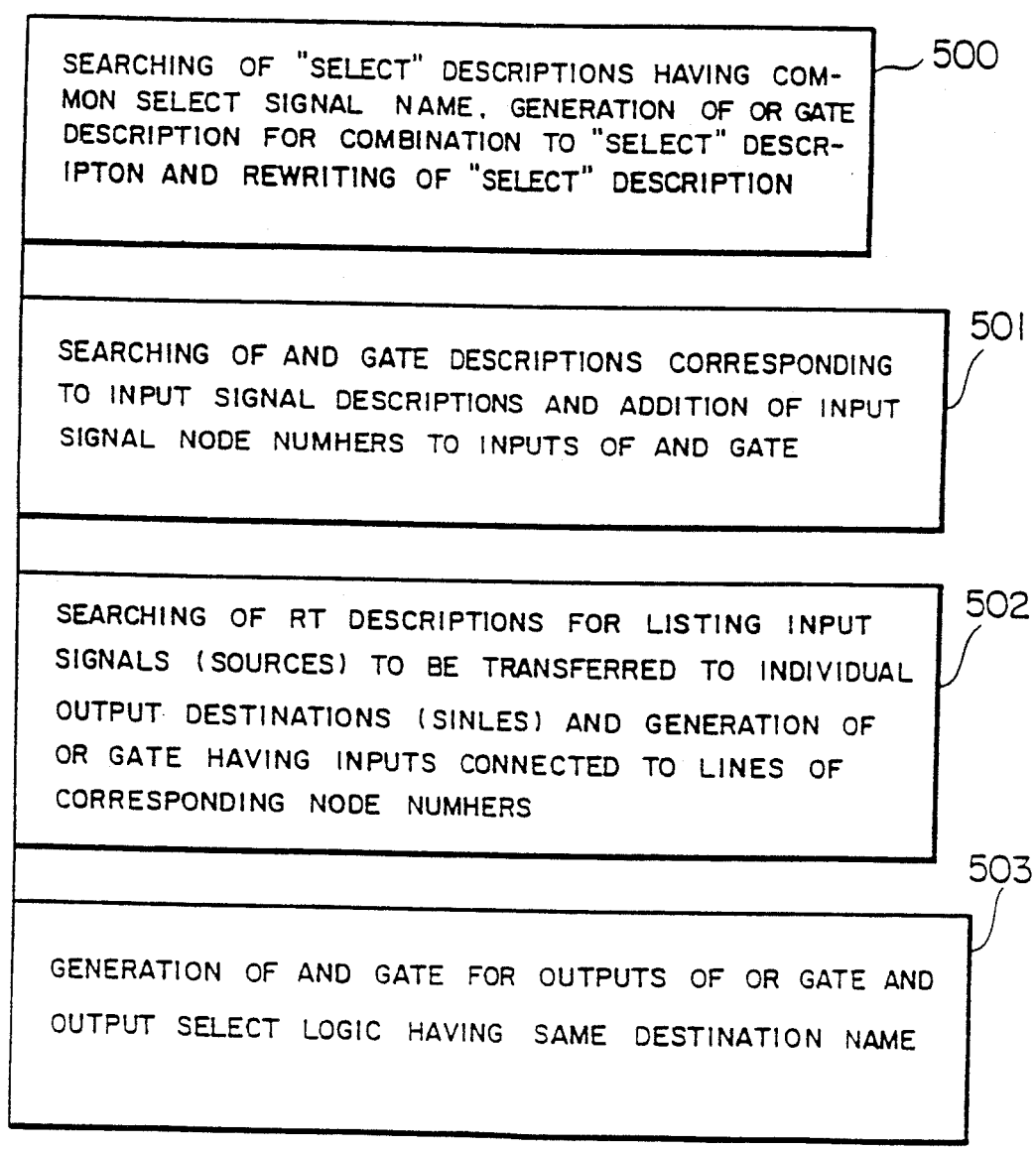

First at a step 500, the lists shown in FIG. 11 are the "select" descriptions having a common signal name for the input signal or the output destination signal, being followed by generation of an OR gate description combining the "select" descriptions as found and rewriting thereof. The rewriting of the "select" description is performed in such a manner in which the "select" descriptions having the common signal name are removed and instead thereof the "AND" descriptions of the common signals to be inputted to a common OR gate are generated, wherein the "select" description is moved to a position succeeding to the newly generated OR gate description.

More specifically, in the list shown in FIG. 11(a), no common signal is present. Accordingly, no processing is performed for the generation of an OR gate and the rewriting of the "select" description. Suppose, however, that the common signal is present in the list shown in FIG. 11(a), as follows:

[AND, [0, 2], 200][select, 200, B]

[AND, [1, 2], 201][select, 201, B]

[AND, [0, 3], 202][select, 202, C]

At that time, an OR gate is generated with the "select" descriptions being rewritten to be stored in the work memory module 6, as follows:

[AND, [0, 2], 200]

[AND, [1, 2], 201]

[AND, [0, 3]202][select, 202, C]

[OR, [200, 201], 203][select, 203, B]

On the other hand, the list shown in FIG. 11(b) contains the common signal names "A" and "E" each in number of two. Accordingly, OR gates are generated with the "select" descriptions being rewritten to be subsequently stored in the work memory module 6, as follows:

[AND, [0, 2], 200][select, 200, B]

[AND, [1, 2], 201][select, 201, C]

[AND, [0, 3], 202][select, 202, D]

[AND, [2, 4], 203][AND, [0, 4], 204]

[AND, [2, 5], 205][AND, [0, 5], 206]

[OR, [203, 204], 207], [select, 207, A]

[OR, [205, 206], 208], [select, 208, E]

With regard to the meanings of the descriptions enumerated above, the description, for example, [OR, [203, 204], 207] means that lines having the node numbers "203" and "204" are connected to the input of the OR gate of concern, the output of which in turn has connected thereto a line having the node number "207".

Next, at a step 501 in FIG. 12, the input signal node numbers are added to the inputs of the AND gate corresponding to the input signal descriptions.

More specifically, the input signals are of three types "B", "C" and "D", as shown in FIG. 3 and expressed in terms of the node numbers "101", "103" and "105", respectively, as described hereinbefore. These node numbers are added to the corresponding "AND" description in the "select" descriptions for the input select logic described above. The results are as follows:

---
[AND, [0, 2, 101], 200] [select, 200, B]
[AND, [1, 2, 103], 201] [select, 201, C]
[AND, [0, 3, 105], 202] [select, 202, D]
[AND, [2, 4], 203] [AND, [0, 4], 204]
[AND, [2, 5], 205] [AND, [0, 5], 206]
[OR, [203, 204], 207] [select, 207, A]
[OR, [205, 206], 208] [select, 208, E]
---

At a step 502 in FIG. 12, RT descriptions are searched for enumerating the input signals (sources) to be transferred to the individual output destinations (sinks) and an OR gate having inputs connected to lines having the node numbers corresponding to the input signals is generated. The OR gates 209 and 210 shown in FIG. 13 are thus generated.

More specifically, thee is the possibility that the input signal "B", "C" or "D" may be transferred to the output destination or sink "A" and that the input signal "B", "C" or "D" may be transferred to the sink E, as can be seen in FIG. 3. Accordingly, by referring to the "select" descriptions, OR gate descriptions and "input" descriptions are generated as follows:

[OR, [200, 201, 202], 209][Input₁₃for, A, 209]

[OR, [200, 201, 202], 210][Input₁₃for, E, 210]

Description [Input₁₃for, A, 209] means that the input corresponding to the output "A" is the one having the node number "209".

Next, at a step 503 in FIG. 12, an AND gate is generated for the outputs ([Input_for, A, 209], [Input_for, E, 210]) of the abovementioned "OR" description and the outputs of the corresponding output select logic ([select, 207, A], [select, 208, E]). In other words, the AND gates having as the inputs the node numbers of the "input" description and "select" description containing a common output destination (sink) signal name is generated. Thus, there are generated

[AND, [207, 209], 211]

[AND, [208, 210], 212]

The series of the processings described above bring about the wiring information for the logic circuit, as follows:

[AND, [0, 2, 101], 200]

[AND, [1, 2, 103], 201]

[AND, [0, 3, 105], 202]

[AND, [2, 4], 203]

[AND, [0, 4], 204]

[AND, [2, 5], 205]

[AND, [0, 5], 206]

[OR, [203, 204], 207]

[OR, [205, 206], 208]

[OR, [200, 201, 202], 209]

[OR, [200, 201, 202], 210]

[AND, [207, 209], 211]

[AND, [208, 210], 212]

A logic diagram corresponding to the above wiring information is shown in FIG. 13. This logic diagram should preferably be outputted on an output device such as a display, printer or the like.

In the logic generating system according to the present invention, the logic gate level number managing module 8 serves to store and manage the numbers of logic gate levels for each of the input signal (source) select logic generating module, the output destination signal (sink) select logic generating module and a combination logic generating module completed by combining together the input signal select logic generating module and the output destination signal select logic generating module. By determining arithmetically the numbers of the logic gate levels, a delay time involved by the gates intervening between the input and the output can be at least approximately estimated to provide a parameter for evaluating the quality of the logic circuit as generated. The numbers of the logic gate levels of the whole circuit can be determined as a total sum of the numbers of the logic gate levels in the individual logic generating modules.

According to the present invention, the numbers of the logic gate levels of the individual logic generating modules and/or in the whole circuit can be outputted to a display, printer or the like through the output module 9 shown in FIG. 9 immediately after the generation of the logic circuit. In the case of the logic circuit shown in FIG. 13, the AND gates 200 to 202 and 203 to 206 constitute the first logic gate level, the OR gates 209; 201 and 207; 208 constitute the second logic gate level and the AND gates 211 and 212 constitute the third logic gate level in the source and sink channels, respectively.

What is claimed is:

1. A decoding type select logic generating method, comprising the steps of:

(a) listing groupwise input signal names and control codes contained in register transfer descriptions, respectively for each of the same input signal names;

(b) performing bit comparison groupwise between said control codes of step (a) to thereby replace any bit of the control codes in a group in which the hamming distance is one by a code meaning "don't care" and retaining only one of said control codes as a valid control code when the comparison of said control codes shows coincidence as the result of said replacement;

(c) generating an AND gate for each of said retained control codes, said AND gates producing output "1" in response to the input of the bit signals of said control code;

(d) generating first AND gates by adding signal lines to the input of said AND gates, said signal lines corresponding to said input signal names, respectively;

(e) generating a first OR gate receiving as inputs those output signals of said first AND gates having the same output destination signal name, respectively;

(f) listing groupwise the output destination signal names contained in the register transfer descriptions and control codes for commanding execution of the register transfers, respectively, for each of the same output destination signal names;

(g) performing bit comparison groupwise between said control codes of step (f) to thereby replace any bit of the control codes in a group in which the hamming distance is one by a code meaning "don't care" and retaining only one of said control codes as a valid control code when the comparison shows coincidence as the result of said replacement;

(h) generating second AND gates for said control codes retained after step (g), said second AND gate producing output of "1" in response to the input of the bit signals of said control codes retained in step (g); and (i) generating a third AND gate receiving as inputs the outputs having the same output destination signal name from the outputs of said second AND gates and said first OR gate.

2. A logic generating method according to claim 1, wherein when there are a plurality of retained control codes that differ from one another, said step of generating a first OR gate includes:

(a) generating a third OR gate receiving as inputs the outputs of the plurality of said AND gates, one generated for each of said control codes; and (b) generating said first OR gate having an input supplied with the output of said third OR gate.

3. A logic generating method according to claim 1, further comprising the steps of:

(a) counting the input signals to said AND gates and said OR gates; and (b) dividing said AND gates and said OR gates to generate an additional AND gate or to satisfying a constraint imposed on the number of said input signal lines, when said count exceeds a predetermined value.

4. A logic generating method according to claim 2, further comprising the steps of:

(a) counting the input signals to said AND gates and said OR gates; and (b) dividing said AND gates and said OR gates to generate an additional AND gate or to satisfy a constraint imposed on the number of said input signal lines, when said count exceeds a predetermined value.

5. A logic generating method according to claim 1, further comprising the steps of:
   (a) storing and managing numbers of logic gate levels on a division basis for each of an input signal name select logic generating part, an output destination signal name select logic generating part and a wired logic generating part for completing a whole logic circuit by combining said input name select logic generating part and said output destination select logic part;
   (b) determining arithmetically said numbers of said logic gate levels in said whole logic circuit as a sum of said numbers of said logic gage levels in said logic generating parts; and
   (c) outputting said stored numbers of said logic gate levels and/or said calculated numbers of said logic gate levels onto an output apparatus.

6. A logic generating method according to claim 2, further comprising the steps of:
   (a) storing and managing numbers of logic gate levels on a division basis for each of an input signal name select logic generating part, an output destination signal name select logic generating part and wired logic generating part for completing a whole logic circuit by combining said input name select logic generating part and said output destination select logic part;
   (b) determining arithmetically said numbers of said logic gage levels in said whole logic circuit as a sum of said numbers of said logic gage levels in said logic generating parts; and
   (c) outputting said stored numbers of said logic gage levels and/or said calculated numbers of said logic gate levels onto an output apparatus.

7. A logic generating method according to claim 3, further comprising the steps of:
   (a) storing and managing numbers of logic gate levels on a division basis for each of an input signal name select logic generating part, an output destination signal name select logic generating part and a wired logic generating part for completing a whole logic circuit by combining said input name select logic generating part and said output destination select logic part;
   (b) determining arithmetically said numbers of said logic gage levels in said whole logic circuit as a sum of said numbers of said logic gage levels in said generating parts; and
   (c) outputting said stored numbers of said logic gage levels and/or said calculated numbers of said logic gate levels onto an output apparatus.

8. A logic generating method according to claim 4, further comprising the steps of:
   (a) storing and managing numbers of logic gate levels on a division basis for each of an input signal name select logic generating part, an output destination signal name select logic generating part and a wired logic generating part for completing a whole logic circuit by combining said input name select logic generating part and said output destination select logic part;
   (b) determining arithmetically said numbers of said logic gage levels in said whole logic circuit as a sum of said numbers of said logic gate levels in said logic generating parts; and
   (c) outputting said stored numbers of said logic gate levels and/or said calculated logic numbers of said logic gate levels an output apparatus.

* * * * *

UNITED STATES PATENT AND TRADEMARK OFFICE
CERTIFICATE OF CORRECTION

PATENT NO. : 5,065,335

DATED : November 12, 1991

INVENTOR(S) : Takayoshi Yokota, et al

Page 1 of 3

It is certified that error appears in the above-identified patent and that said Letters Patent is hereby corrected as shown below:

| Column | Line | |
|---|---|---|
| 1 | 54 | After "labour" insert --,--; before "detailed" delete "the". |
| 1 | 56 | After "misnomer" insert --.--. |
| 1 | 59 | Change "is to provide" to --provides--. |
| 2 | 41-42 | Change "makes appearance an" to --makes an appearance--. |
| 2 | 44 | Change "5(b," to --5(b),--. |
| 2 | 56 | After "name" insert --,--. |
| 3 | 11 | After "invention" change ";" to --.--. |
| 3 | 12 | Change "FIG." to --FIGS.--; after "diagrams" insert --showing data--. |
| 3 | 18 | Change "diagram" to --diagrams--. |
| 3 | 67 | After "while" delete "characters LMNs represent, respectively," and insert --each character string LMN represents--. |
| 4 | 42 | Change "[11]" to --[ ]--. |
| 6 | 31 | After "codes" insert --,--. |

UNITED STATES PATENT AND TRADEMARK OFFICE
CERTIFICATE OF CORRECTION

PATENT NO.  : 5,065,335

DATED       : November 12, 1991

INVENTOR(S) : Takayoshi Yokota, et al

It is certified that error appears in the above-identified patent and that said Letters Patent is hereby corrected as shown below:

| Column | Line | |
|---|---|---|
| 8  | 3  | After "FIG. 6" insert --,--. |
| 9  | 56 | Change "and" to --an--. |
| 10 | 2  | After "code" insert --of--. |
| 10 | 39 | Delete "it is example,". |
| 11 | 6  | Change "are resulted" to --result--. |
| 11 | 12 | After "200, B]" insert --on the same row means that as a result of selection, --. |
| 11 | 23 | Change "is" to --searched to find--. |
| 12 | 51 | Change "Input$_{13}$for," to --Input__for,--. |
| 12 | 52 | Change "Input$_{13}$for," to --Input__for,--. |
| 12 | 55 | Change "Input$_{13}$for," to --Input__for,--. |
| 14 | 61 | After "or" delete "to satisfying" and insert --OR gate to satisfy--. |
| 15 | 2  | After "or" insert --OR gate--. |
| 15 | 19 | Change "gage" to --gate--. |
| 15 | 36 | Change "gage" to --gate--. |
| 15 | 37 | Change "gage" to --gate--. |

UNITED STATES PATENT AND TRADEMARK OFFICE
CERTIFICATE OF CORRECTION

PATENT NO. : 5,065,335

DATED : November 12, 1991

INVENTOR(S) : Takayoshi Yokota, et al

It is certified that error appears in the above-identified patent and that said Letters Patent is hereby corrected as shown below:

| Column | Line | |
|--------|------|---|
| 16 | 1 | Change "gage" to --gate--. |
| 16 | 15 | Change "gage" to --gate--. |
| 16 | 16 | Change "gage" to --gate--. |
| 16 | 18 | Change "gage" to --gate--. |
| 16 | 32 | Change "gage" to --gate--. |
| 16 | 37 | After "levels" insert --onto--. |

Signed and Sealed this

Eleventh Day of May, 1993

Attest:

MICHAEL K. KIRK

*Attesting Officer*     Acting Commissioner of Patents and Trademarks